United States Patent
Shimada et al.

(10) Patent No.: US 7,400,029 B2
(45) Date of Patent: Jul. 15, 2008

(54) LED ILLUMINATION SYSTEM

(75) Inventors: Junichi Shimada, Kyoto (JP); Yoichi Kawakami, Kusatsu (JP)

(73) Assignee: Yanchers Inc., Kyoto (JP)

( * ) Notice: Subject to any disclaimer, the term of this patent is extended or adjusted under 35 U.S.C. 154(b) by 80 days.

(21) Appl. No.: 10/539,079

(22) PCT Filed: Dec. 15, 2003

(86) PCT No.: PCT/JP03/16056

§ 371 (c)(1),
(2), (4) Date: Jun. 15, 2005

(87) PCT Pub. No.: WO2004/055911

PCT Pub. Date: Jul. 1, 2004

(65) Prior Publication Data

US 2005/0276052 A1 Dec. 15, 2005

(30) Foreign Application Priority Data

Dec. 16, 2002 (JP) ............................. 2002-363893

(51) Int. Cl.
*H01L 29/06* (2006.01)
(52) U.S. Cl. ................ 257/625; 257/675; 257/712; 257/719; 257/E33.075
(58) Field of Classification Search ................ 257/276, 257/625, 675, 706, 707, 712–722, 796
See application file for complete search history.

(56) References Cited

U.S. PATENT DOCUMENTS 6,498,355 B1 * 12/2002 Harrah et al. ................. 257/99
6,836,014 B2 * 12/2004 Hunt et al. ................. 257/706

(Continued)

FOREIGN PATENT DOCUMENTS

JP   U 62-103252   7/1987

(Continued)

*Primary Examiner*—Wai-Sing Louie
(74) *Attorney, Agent, or Firm*—Oliff & Berridge, PLC

(57) ABSTRACT

The present invention is achieved with the object of providing an illumination system formed of an LED light emitting body and a socket which can appropriately release heat from LED chips. This object is achieved in the following manner. A heat conducting layer 12 made of diamond is provided on a substrate 11, and on top of this, a conductive layer 13 having a predetermined pattern is formed. LED chips 16 are mounted in predetermined positions on the conductive layer 13. Terminals of the conductive layer 13 and electrodes of the LED chips 16 are connected to each other. A connector part 14 for the connection to a socket is provided in an end portion of the substrate 11. The heat conducting layer 12 on the connector part 14 makes thermal contact with the heat conducting layer provided on the inner surface of the opening of the socket. A current is supplied to respective LED chips 16 through the conductive layer 13 from the socket, and respective LED chips 16 emit light. Heat that is generated in the LED chips 16 is released to the outside of the illumination system from the socket through the conductive layer 13, the heat conducting layer 12 and the connector part 14. As a result of this, an increase in the temperature of the LED chips 16 can be prevented, and an LED illumination system that emits a large amount of light can be formed.

9 Claims, 5 Drawing Sheets

U.S. PATENT DOCUMENTS

| | | | |
|---|---|---|---|
| 7,173,329 B2 * | 2/2007 | Frutschy et al. | 257/698 |
| 2003/0178627 A1 * | 9/2003 | Marchi et al. | 257/80 |

FOREIGN PATENT DOCUMENTS

| | | | |
|---|---|---|---|
| JP | A 2-163955 | 6/1990 | |
| JP | A 2002-232009 | 8/2002 | |
| JP | A 2002-329896 | 11/2002 | |
| JP | A 2002-343104 | 11/2002 | |

* cited by examiner

LED ILLUMINATION SYSTEM

TECHNICAL FIELD

The present invention relates to an illumination system that uses a light emitting diode (LED), and in particular to an LED illumination system that emits a large amount of light.

BACKGROUND ART

As a result of the development of gallium nitride based LEDs (GaN-LEDs) that emit blue light, utilization of LEDs as illumination devices have recently been the focus of attention. When used as an illumination device, gallium nitride based LEDs have a variety of properties, such as (a) the life of elements is long, almost infinite for practical use, (b) energy efficiency is high, and little heat is released, (c) luminosity is high, (d) light controlling properties are excellent (a desired tone of color can be generated), and (e) the size of a single element is very small, making it possible to mount elements in a desired form, as compared to conventional illumination devices, such as incandescent light bulbs and fluorescent lamps.

It is desirable for white light to be gained in order to use LEDs as light sources. In recent years, a white light source (white LEDs) has been implemented by covering a GaN-LED with an yttrium aluminum garnet fluorescent thin film, and therefore, it can be expected that LED illumination devices will be more widely used in the future.

It is necessary to make LED illumination devices easy to handle in the same manner as conventional electric lamps and fluorescent lamps, in order for LED illumination devices to gain widespread in household use. For example, though LEDs have a life that is longer than that of conventional light bulbs and fluorescent tubes, still, in some cases, it becomes necessary to change them in general homes. Therefore, it is desirable for the attachment and removal of LED light sources (which corresponds to light bulbs and fluorescent tubes) to and from illumination devices to be able to be carried out in the same manner as or more easily than conventional electric lamps and the like.

However, such LED illumination devices where attachment and removal of an LED light source can be easily carried out have not been researched.

In addition, it is necessary to solve the problem where the temperature of LED chips increases when supplied with a large amount of power, as described below, when LEDs are used for an illumination device.

At present, the intensity of light flux that is gained from a white LED, as described above, is several lm (lumen) when the LED is in bullet form (having a diameter of 3 mm), and is several tens of lm when the LED is of a large area type with high brightness. However, it is necessary to gain light flux of 1000 to several thousands of lm from such a white LED, in order for the white LED to be used as a light source for a liquid crystal projector or a light source for the headlights of an automobile. In order to achieve this, it is necessary to supply power of 20 W to 100 W or greater to the white LED, because the light emitting efficiency of white LEDs at present is approximately 25 (lm/W) at the maximum when the white LED is of a type that is currently in use, and approximately 50 (lm/W) at the maximum when the white LED is of a type that is prepared in a laboratory.

In the case where such a large amount of power is supplied to a presumably small mounting region for a light source as that described above, there is a risk that the LED chip may store heat and the temperature may increase. In addition, even in the case where this heat is conveyed to the substrate on which the LED chip is mounted, this substrate stores heat, which increases the temperature, and thereby, there is a risk that the temperature of the LED chip may also increase. LEDs are semiconductor devices, and therefore, the higher the temperature becomes, the higher the probability of occurrence of non-radiative recombination becomes, reducing the light emitting efficiency. Accordingly, it is necessary to appropriately release heat generated in an LED chip to the outside so as to prevent the temperature of the LED chip from excessively increasing, in order to make an LED illumination device emit a large amount of light efficiently.

Japanese Unexamined Patent Publication No. 2002-232009 describes the release of heat from the surface of a conductive pattern for supplying power to LEDs which are provided on a flexible substrate (see [0050] and FIG. 4), and the release of heat from a fin for heat release made of a silicone resin which is provided on the rear surface of a flexible substrate (see [0046] and FIG. 8). Here, concerning the material of the flexible substrate, there is a description "flexible resin member" in [0032]. Therefore, the function of a substrate in the release of heat has not yet been sufficiently looked into.

Meanwhile, the present inventors have proposed that an LED chip be mounted on a diamond substrate (or a substrate of which the surface is covered with diamond or diamond carbon) in order to convey to the outside heat that has been generated in the LED chip, in Japanese Unexamined Patent Publication No. 2002-329896 (see [0020] and FIG. 3). The thermal conductivity of diamond at room temperature is approximately 20 W/cmK, which is higher than that of a substrate that is conventionally used to mount an LED chip (sapphire, quartz, SiC, GaN, AlN or the like) by one digit to two digits. Therefore, the heat that is generated in an LED chip is absorbed by the diamond substrate so that an increase in the temperature of the LED chip can be restricted.

The substrate for mounting an LED chip is as thin as several mm, so that the space for installment can be made small. Therefore, heat from the LED chip tends to be stored in the substrate. In Japanese Unexamined Patent Publication No. 2002-329896, the heat that is absorbed by the diamond substrate is "released to the outside from the bottom and the sides" of the substrate ([0020]). However, in the case where the density of installment of LEDs is further increased, release of heat from the substrate to the surrounding air becomes insufficient, making the temperature of the substrate increase. Therefore, there is a risk that the heat generated in an LED chip may not be appropriately released.

The present invention is provided in order to solve such problems, and an object thereof is to provide an LED illumination system where an LED light source can be easily attached and removed. Another purpose of the present invention is to allow such an LED illumination system to appropriately release the heat that is generated in LEDs to the outside of the system.

DISCLOSURE OF THE INVENTION

An LED illumination system according to the present invention that is formed in order to solve the above described problems is characterized by being provided with:

a) an LED module in which
a substrate,
a heat conducting layer provided on the substrate and made of an insulating material,
a conductive layer provided on the heat conducting layer and having a predetermined pattern, a light emitting diode chip provided in a predetermined position on the conductive layer, a connector part having a module thermally contacting portion for conveying heat in the heat conductive layer and a power supplying terminal provided in an end portion of the above described substrate, are provided; and b) a socket for supporting the above described connector part, in which a socket thermally contacting portion having a surface contact with the above described module thermally contacting portion, and a terminal connected to the power supplying terminal of the above described connector part, are provided.

An LED illumination system according to the present invention is formed of an LED module and a socket. From among these, the LED module is an LED light source which corresponds to a light bulb or a fluorescent tube in a conventional illumination device. The LED module is provided with a connector part, and this connector part is attached to the socket, and thereby, one illumination system set is formed.

In the following, the respective configurations of the LED module and the socket are described.

The LED module is formed as follows. The substrate that becomes the foundation of the module also serves to absorb heat from LEDs. Concerning the material of the substrate, a substrate made of ceramics or a single crystal of, for example, AlN, GaN, SiC or the like is used. A heat conducting layer made of an insulating material is provided on the substrate. Concerning the material of the heat conducting layer, it is desirable to use diamond which has a thermal conductivity as high as approximately 20 W/cmK (value at temperature of 298 K), diamond-like carbon or carbon nanotubes having a thermal conductivity approximately two times higher than diamond. A conductive layer having a predetermined pattern is provided on the heat conducting layer. This predetermined pattern forms terminals for supplying power to the conductive layer from the outside, and a circuit and terminals for supplying power to LED chips from the conductive layer. In addition, a region that makes surface contact with LED chips may be provided on the conductive layer. The majority of regions of the conductive layer from which the portions that are required for electrical insulation from the terminals of the conductive layer can be used as the above described thermally contacting region. As for the material of the conductive layer, gold having an excellent conductivity and heat conducting properties, for example, is used. Electrodes of LED chips are connected to the above described terminals of the conductive layer by means of soldering, and thus, the LED chips are provided. At this time, the LED chips make surface contact with the heat conducting layer or the above described thermally contacting region of the conductive layer.

The connector part for the connection with a socket is provided to an end portion of the LED module, as described above. This connector part is provided with a module thermally contacting portion that makes thermal surface contact with the below described socket thermally contacting portion. It is desirable to use diamond, diamond-like carbon or carbon nanotubes for this module thermally contacting portion, in the same manner as in the heat conducting layer. In addition, power supplying terminals for supplying power are provided to the connector part. The connector part may be in male screw form, in the same manner as, for example, a light bulb, or it may be in plate form.

The socket has a structure for supporting the connector part of the LED module. The inner side of the opening of the socket may have a male screw form, in the same manner as the socket of a light bulb, or may be made into a structure for securing the connector part in plate form by pinching it by means of a spring that is provided thereto, depending on the form of the connector part. A socket thermally contacting portion is provided in a portion on the inner side of the opening of the socket where the LED module makes surface contact with the module thermally contacting portion when the LED module is attached to the socket. As a result of this, the socket thermally contacting portion and the module thermally contacting portion make thermal contact with each other. In addition, terminals are provided in portions that are connected to the above described power supplying terminals of the connector part. Power is supplied to the terminals of this socket, and thereby, power can be supplied to LED chips from the above described power supplying terminals of the connector part through the conductive layer.

The LED module and the socket are formed as described above, and thereby, attachment and removal of the LED module can be easily carried out. In addition, the power supplying terminals of the connector part and the terminals of the socket are connected to each other simply by attaching the LED module to the socket, and therefore, it is not necessary to separately carry out a wiring process for supplying power at the time of attachment or removal of the LED module.

Next, the process through which heat that has been generated in an LED chip is released to the outside of the system in the LED illumination system of the present invention is described. The heat of an LED chip is first conveyed to the thermally contacting region of the conductive layer. The conductive layer has a predetermined pattern in layer form, and therefore, the heat diffuses through the entirety of the conductive layer. In addition, the entirety of the conductive layer makes surface contact with the conductive layer, and therefore, this heat diffuses to the heat conducting layer through the entirety of the conductive layer.

The heat that has diffused through the entirety of the LED module is partially released to the surrounding air directly from the surface of the heat conducting layer, and furthermore, in the LED illumination system of the present invention, the heat of the LED module is conveyed to the socket through the module thermally contacting portion and the socket thermally contacting portion. This heat is released to the surrounding air from the socket. In this configuration, the heat that is generated in an LED chip can be released to the surrounding air more efficiently. Here, as described above, diamond, diamond-like carbon or carbon nanotubes having a high thermal conductivity are used as the material for the heat conducting layer, and thereby, the heat of the heat conducting layer can be quickly conveyed to the module thermally contacting portion. In addition, it is desirable for the module thermally contacting portion and the socket thermally contacting portion to be formed of a material having a good heat conductance. Therefore, diamond, diamond-like carbon and carbon nanotubes, for example, can be used as the material for the two contacting parts, in the same manner as in the heat conducting layer. A metal may be used for a portion of the two contacting parts that does not make contact with the power supplying terminals. Furthermore, it is desirable for the module thermally contacting portion and the socket thermally contacting portion to have a structure where thermal contact is made by as large an area as possible, in order for the heat conductance between the two contacting parts to be as efficient as possible.

It is further desirable for the LED illumination system of the present invention to have a structure for releasing heat from the socket to the surrounding air. The outside of the socket may have a structure in, for example, fin form, so that heat can be released from the socket itself. In addition, heat may be released to the surrounding air from a reflector for delivering light, which reflects light emitted by an LED.

Though in the above described configuration, the light emitting efficiency can be prevented in large part from lowering due to an increase in the temperature of an LED chip, a temperature sensor for detecting overheating of an LED chip may be provided, in order to further enhance safety. Though typically, a temperature sensor is placed in the proximity of an LED chip, so that the temperature of the LED chip can be directly measured, a temperature sensor may be provided on the surface of the conductive layer or the heat conducting layer, or buried in the substrate so that the temperature in any of these portions can be measured, and the temperature of the LED chip can be measured indirectly. When such a temperature sensor detects that the temperature of an LED chip exceeds a predetermined temperature, the power supply to the LED chip is reduced or stopped. After that, when the temperature of the LED chip becomes the above described predetermined temperature or a predetermined temperature that is lower than this, the amount of power supplied to the LED chip is returned to the original. In addition, the temperature of an LED chip that has been placed in the vicinity of the center increases more easily than that of an LED chip that has been placed in the vicinity of an end of the LED module, because the LED chip that has been place in the vicinity of the center is easily affected by heat from surrounding LED chips, within the LED module. Therefore, it is desirable to place a temperature sensor, as described above, in each LED chip, so as to control the system in such a manner that the power supplied to an LED chip of which the temperature exceeds a predetermined value is reduced. In order to carry out such a control, it is desirable for this LED illumination system to be provided with a control part for controlling the power supplied to LED chips in response to signals received from the temperature sensors. This control part includes a memory part for storing a program for the control of the system.

The LED illumination system of the present invention allows the LED module which corresponds to a conventional light bulb or the like to be easily attached to and removed from the socket. As a result of this, handling of an LED illumination system of the present invention becomes as easy as or easier than that of a conventional electric lamp or the like.

The LED module of the present invention is a light source that does not deteriorate semi-permanently, and therefore, is not discarded, when its life has expired, unlike conventional light bulbs and fluorescent tubes. In addition, it is possible to recycle LED modules that have become unnecessary at the user's convenience, for example, because the user wishes to renovate through construction, since the life of the LED modules is semi-permanent. Such recycling becomes easy according to the present invention, in which attachment and removal of LED modules is made easier. As described above, an LED module of the present invention can be said to be a light source that is environmentally friendly.

In addition, in the LED illumination system of the present invention, heat from an LED chip is conveyed to the heat conducting layer via the conductive layer for supplying power, and thereby, heat from the LED chip can be made to diffuse quickly through the heat conducting layer, by increasing the heat conducting efficiency between the LED chip and the heat conducting layer. This becomes possible because the conductive layer makes excellent thermal contact with both the LED chip and the heat conducting layer, and the conductive layer spreads in two dimensions in a predetermined pattern, providing a broad thermally contacting portion vis-a-vis the heat conducting layer. Furthermore, thermally contacting portions having a high thermal conductivity are respectively provided to the connector part of the LED module and the socket, so as to make thermal surface contact between the two thermal contacting parts and make heat from the LED module be conveyed to the socket, and thereby, the heat from the LED module can be released to the surrounding air through the socket. In the above described configuration, an increase in the temperature of the LED chips can be prevented.

As described above, an increase in the temperature of LED chips is prevented, and therefore, it becomes possible to densely place LED chips. Therefore, it becomes possible to implement an LED illumination system that can emit a large amount of light.

BEST MODE FOR CARRYING OUT THE INVENTION

Figure 1:
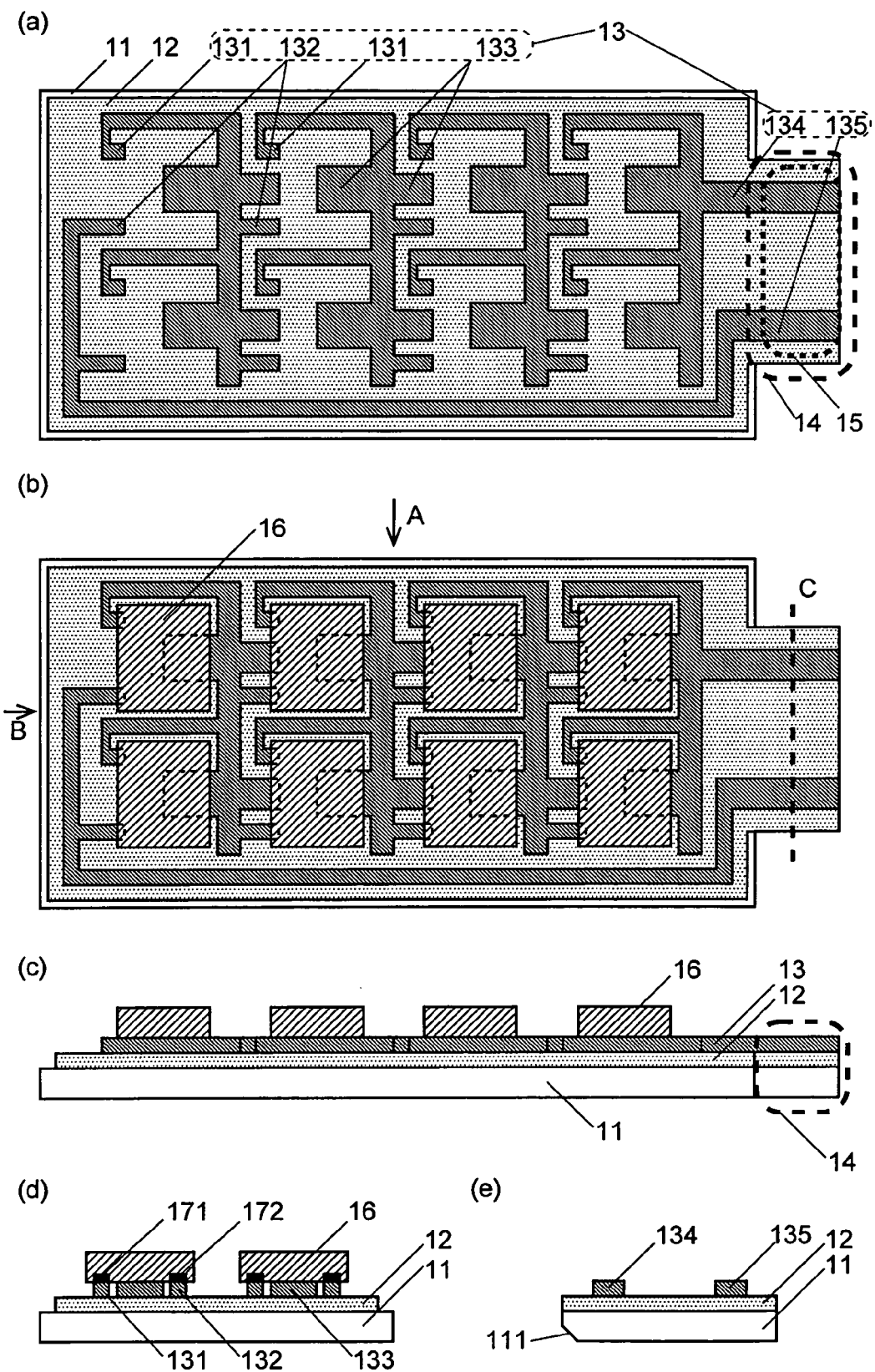
FIGS. 1(a) to 1(e) are plan diagrams and cross sectional diagrams showing an LED module of an LED illumination device according to one embodiment of the present invention.

FIGS. 1(a) to 1(e) show an LED module in an LED illumination system according to one embodiment of the present invention. FIG. 1(a) is a plan diagram showing the LED module before LED chips 16 is mounted. FIG. 1(b) is a plan diagram showing the LED module that has been completed by mounting LED chips 16 on the LED module of FIG. 1(a). FIGS. 1(c) and 1(d) show the LED module of FIG. 1(b) as viewed from directions A and B, respectively. FIG. 1(e) is a cross sectional diagram along broken line C.

The configuration of this LED module is described below. Eight LED chips 16 are mounted on this module. A heat conducting layer 12 made of diamond is formed on one surface of a substrate 11 made of AlN. A conductive layer 13 having the pattern shown in FIG. 1(a) is formed on the heat conducting layer 12. Gold is used as the material of the conductive layer 13. The pattern of the conductive layer 13 has positive and negative terminals 131 and 132 for supplying power to respective LED chips 16, thermally contacting portions 133 with the LEDs, and positive and negative terminals 134 and 135 for supplying power to the conductive layer 13.

Eight LED chips 16 are mounted on the conductive layer 13 in such a manner that positive and negative electrodes 171 and 172 of the LED chips 16 make contact with the above described terminals 131 and 132, and the other regions make contact with the thermally contacting portions 133 (see FIG. 1(d)). Terminals 171 and 172 of each LED chip 16 are connected to the terminals 131 and 132, respectively, by means of soldering.

A connector part 14 for connection to a socket is provided to an end portion of the substrate 11. The heat conducting layer 12 in this connector part 14 forms a module thermally contacting portion 15 that makes thermal contact with a socket. The above described terminals 134 and 135 of the conductive layer 13 are formed on one surface of the connector part 14. In addition, as shown in FIG. 1(e), a cut corner 111 is provided along one side from among four sides in the direction of the depth of the connector part 14.

Figure 2:
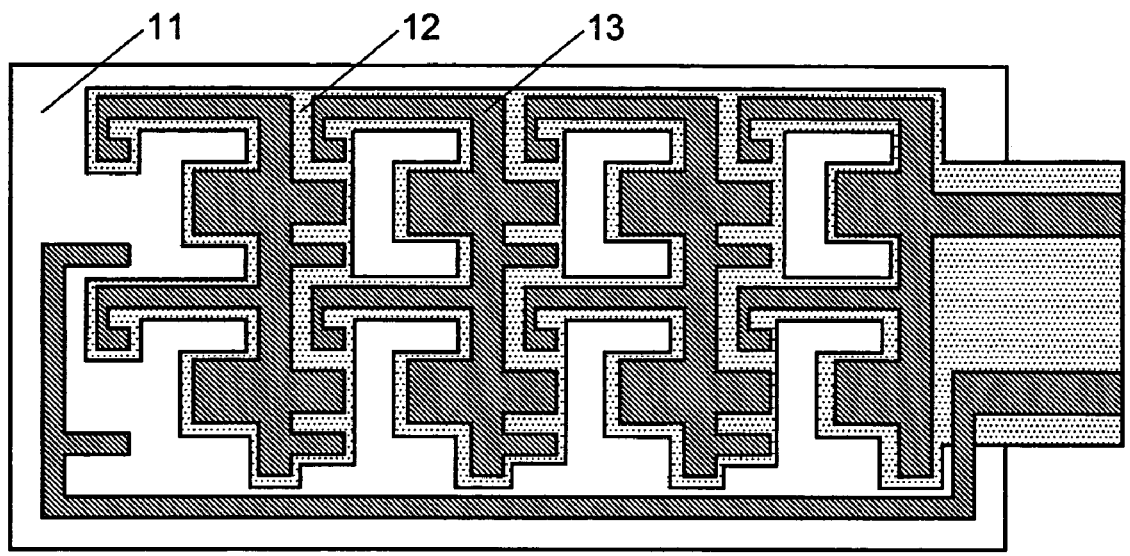
FIG. 2 is a plan view showing an LED module according to another embodiment.

In the case where the heat conducting layer 12 is made of a material having a high heat conductance, such as carbon nanotubes, it is not necessary to provide the heat conducting layer 12 on the entire surface of the substrate 11, as shown in FIG. 1, but rather, a predetermined pattern which follows the shape of the conductive layer 13 may be formed, as shown in FIG. 2. In this configuration, the used amount of material of the heat conducting layer 12 can be reduced.

Figure 3:
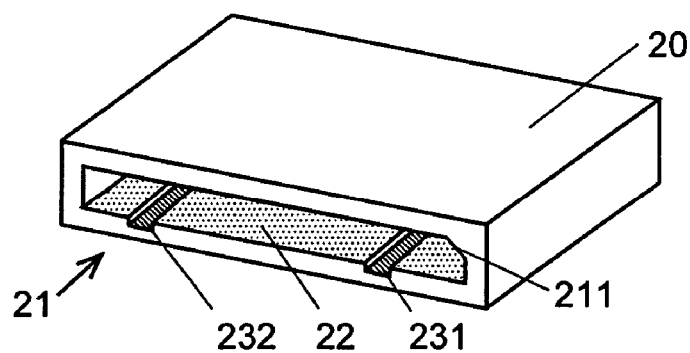
FIG. 3 is a perspective view showing a socket of an LED illumination device according to one embodiment of the present invention.

FIG. 3 shows a socket of an LED illumination device according to one embodiment. A socket thermally contacting portion 22 is formed of a layer of which the material is diamond on one surface of the inner walls of an opening 21 of the socket. Positive and negative terminals 231 and 232 for supplying power to the positive and negative terminals 134 and 135 of the above described connector part 14 are provided in portions that make contact with these terminals when the connector part 14 is inserted. In addition, a filled corner 211 is provided in the opening 21 so as to follow the shape of the cut corner 111 of the connector part. This structure prevents the module from being inserted into the opening 21 of the socket when the front and the rear of the module are inverted. The electrodes of the LEDs have polarities, and therefore, the positive and negative terminals of the module should not be connected to the terminals of the socket in the wrong way by mistake, and such a problem does not arise in this structure.

Figure 4:
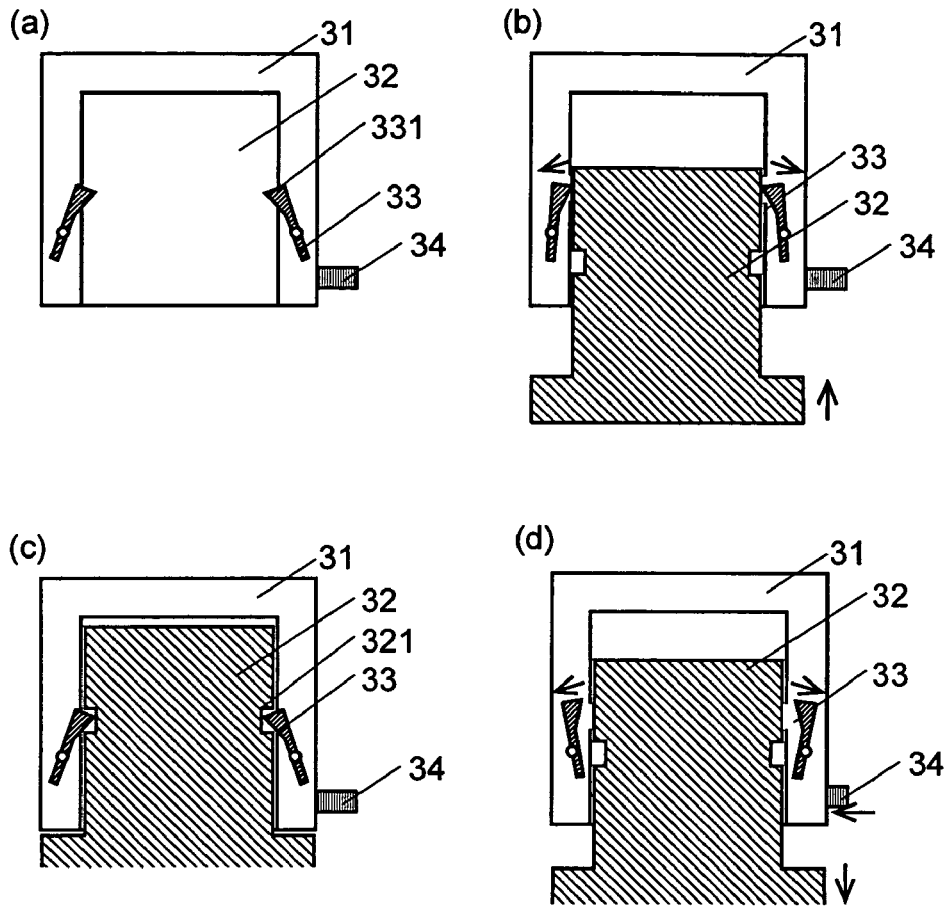
FIGS. 4(a) to 4(d) are diagrams illustrating the structure for attachment and removal of an LED module to and from the socket according to the present embodiment.

In this socket, an LED module attaching and removing device, shown in FIGS. 4(a) to 4(d), is provided, in order to make the attachment and removal of the LED module easy. As shown in FIG. 4(a), stoppers 33 are provided on inner walls of a socket 31. Claws 331 at the ends of these stoppers 33 can be made to protrude in the openings of the socket 31 by means of a spring force. When an LED module 32 is attached to this socket 31, claws 331 of the stoppers 33 are pressed toward the outside by the connector part of the LED module 32 (FIG. 4(b)). Therefore, the connector part can be inserted all the way to the end of the socket 31. When notches 321 of the LED module 32 come to the sides of the claws 331, the claws 331 engage with the notches 321 by means of spring force. As a result of this, the LED module 32 is fixed to the socket 31 (FIG. 4(c)). When the LED module 32 is removed, a button 34 is pressed, so that the claws 331 are pressed to the outside, releasing the LED module 32 from its fixed state (FIG. 4(d)).

Figure 5:
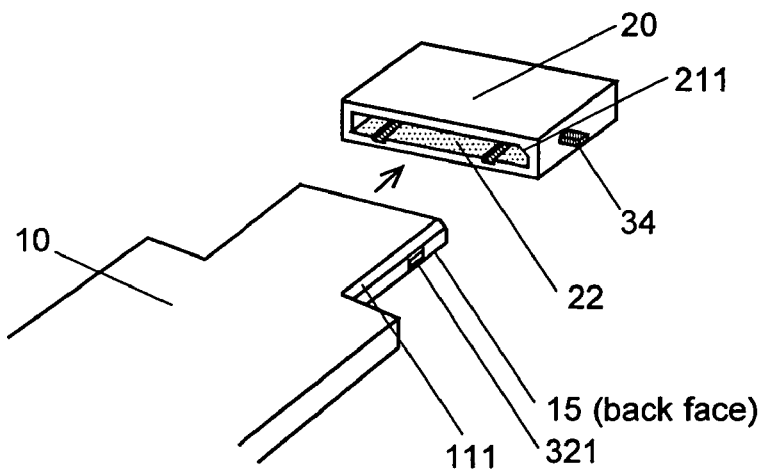
FIG. 5 is a perspective view showing the connection of the LED module to the socket according to the present embodiment.

The connector part 14 of the LED module 10 of FIGS. 1 or 2 is inserted into the opening 21 of the socket of FIG. 3 (see FIG. 5). As a result of this, the module thermally contacting portion 15 of the connector part 14 and the socket thermally contacting portion 22 of socket 20 make surface contact with each other.

Figure 6:
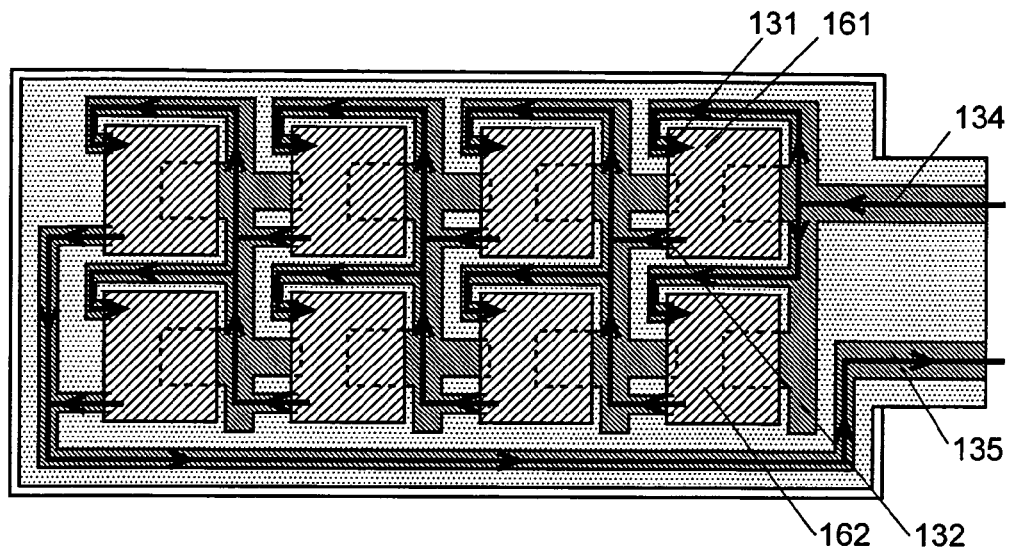
FIG. 6 is a plan view illustrating the current in the conductive layer in the LED module according to the present embodiment.

Supply of power to the LED chips in the LED illumination device according to the present embodiment is describe in reference to FIG. 6, which shows the flow of current within the conductive layer 13. Direct current is supplied to the conductive layer 13 from the power supply through the positive and negative terminals 231 and 232 of the socket and the positive and negative terminals 134 and 135 of the connector part 14 of the LED module. The conductive layer 13 forms a circuit where four pairs of LED chips, in each pair of which the LED chips are connected in parallel (for example, LED chips 161 and 162) are connected in series.

Conveyance of heat that is generated in the LED chips in the LED illumination device according to the present embodiment is described below. Heat is conveyed from the LED chips 16 to the thermally contacting portions 133 of the conductive layer 13. Heat that has flowed from the thermally contacting portions 133 is conveyed two dimensionally within the conductive layer 13. Heat is conveyed from the conductive layer 13 to the heat conducting layer 12. At this time, heat is conveyed from the entirety of the conductive layer 13, and therefore, the efficiency of heat conductance is high. The heat of the heat conducting layer 12 is conveyed from the module thermally contacting portion 15 of the connector part 14 to the socket through the socket thermally contacting portion 22.

Figure 7:
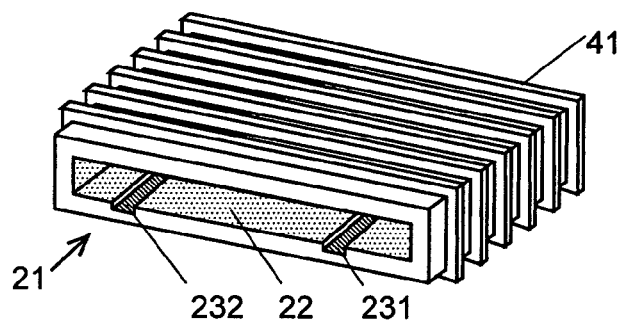
FIG. 7 is a perspective view showing the socket where fins are provided on the external surface according to the present embodiment.

Next, several application examples of the present embodiment are shown. FIG. 7 shows a socket where fins 41 are attached to the external surface. These fins 41 can release heat that has been conveyed from the LED module to the socket efficiently to the surrounding air. It is desirable to use a material that is excellent in the heat conductance and insulation, such as alumina ($Al_2O_3$) or aluminum nitride (AlN) ceramics, as the material for the socket.

Figure 8:
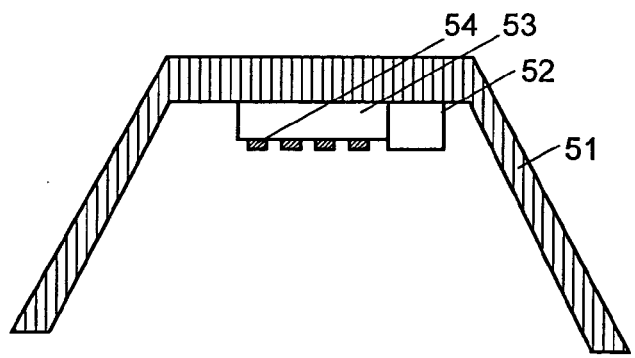
FIG. 8 is a cross sectional diagram showing the LED illumination device where a reflector is provided according to the present embodiment and FIG. 9 is a plan view showing the LED module where a temperature sensor is provided according to the present embodiment.

FIG. 8 shows an LED illumination device where a reflector 51 for reflecting light emitted by the LEDs is provided according to the present embodiment. The reflector 51 makes thermal contact with the bottom (substrate) of a socket 52 and an LED module 53. The heat of the LED module 53 is conveyed to the reflector 51 through the socket 52 and directly conveyed to the reflector 51 from the bottom of the LED module 53, and thereby, released to the surrounding air efficiently.

Figure 9:
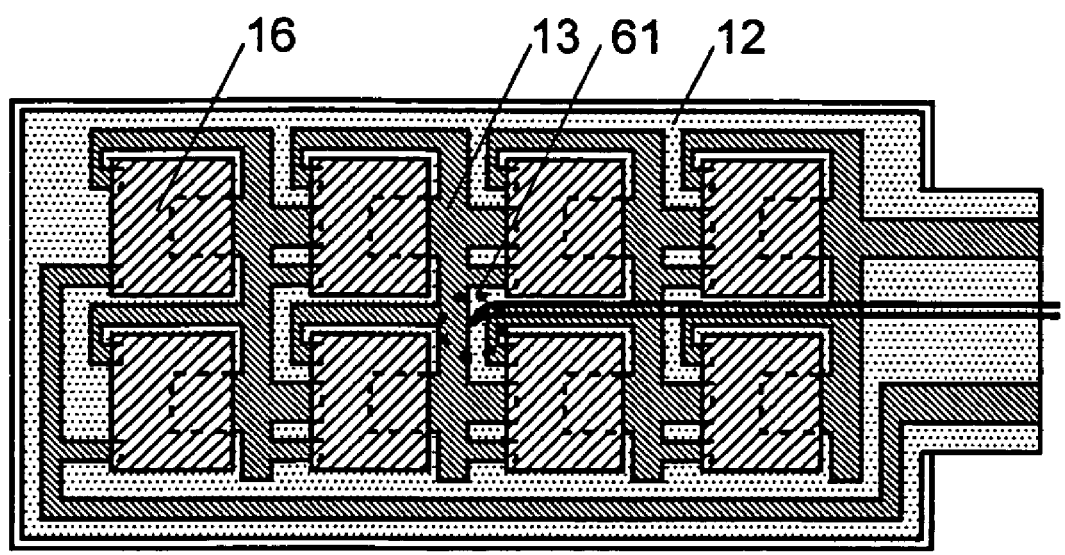

FIG. 9 shows an LED module where a temperature sensor 61 made of thermocouple is provided on the surface of the heat conducting layer 12, in the vicinity of the center. When the temperature of the portion where this temperature sensor is provided increases to a predetermined temperature, at which the LEDs overheat, the power supplied to the LEDs is cut off, preventing an increase in the temperature of the led chips.

The invention claimed is:
1. An LED module, comprising:
a) a substrate;
b) a heat conducting layer provided on said substrate, made of an insulating material, and connecting the later-described predetermined position and the later-described module-thermally-contacting portion;
c) a conductive layer provided on said heat conducting layer, having a predetermined pattern, and connecting the later-described light-emitting diode chip and the later-described power supply terminal;
d) a light emitting diode chip provided in a predetermined position on said conductive layer; and
e) a connector part provided in an end portion of said substrate and having:
a module-thermally-contacting portion for discharging heat from the substrate and the heat conducting layer; and a power supply terminal, wherein the heat conducting layer and the conductive layer are interconnected in the predetermined pattern.

2. The LED module according to claim 1, wherein said heat conducting layer is made of diamond, diamond-like carbon or carbon nanotubes.

3. The LED module according to claim 1, wherein a temperature sensor is provided.

4. A socket for an LED module, which is a socket for supporting the connector part of the LED module according to claim 1, comprising: a socket thermally contacting portion for making a surface contact with the module thermally contacting portion of the connector part; and a terminal connected to the power supply terminal of said connector part.

5. The socket for an LED module according to claim 4, wherein a heat releasing part for releasing heat to the surrounding air is provided around the socket.

6. The LED module according to claim 2, wherein a temperature sensor is provided.

7. A socket for an LED module, which is a socket for supporting the connector part of the LED module according to claim 2, comprising: a socket thermally contacting portion for making a surface contact with the module thermally contacting portion of the connector part; and a terminal connected to the power supply terminal of said connector part.

8. A socket for an LED module, which is a socket for supporting the connector part of the LED module according to claim 3, comprising: a socket thermally contacting portion for making a surface contact with the module thermally contacting portion of the connector part; and a terminal connected to the power supply terminal of said connector part.

9. An LED module, comprising:
a) a substrate;
b) a heat conducting layer provided on said substrate, made of an insulating material, and connecting the later-described predetermined position and the later-described module-thermally-contacting portion;
c) a conductive layer provided on said heat conducting layer, having a predetermined pattern, and connecting the later-described light emitting diode chip and the later-described power supply terminal;
d) a light emitting diode chip provided in a predetermined position on said conductive layer;
e) a connector part provided in an end portion of said substrate and having:
a module-thermally contacting portion for discharging heat from the substrate and the heat conducting layer; and
a power supply terminal; and
f) a socket thermally contacting portion for making a surface contact with the module thermally contacting portion of the connector part; and a terminal connected to the power supply terminal of said connector part, wherein the heat conducting layer and the conductive layer are interconnected in the predetermined pattern.

* * * * *